US012656646B2

(12) United States Patent (10) Patent No.: US 12,656,646 B2
Qiu et al. (45) Date of Patent: Jun. 16, 2026

(54) ARRAY BASE PLATE AND FABRICATING METHOD THEREOF, DISPLAY PANEL AND DRIVING METHOD THEREOF, AND DISPLAYING DEVICE

(71) Applicants: Chengdu BOE Display Sci-tech Co., Ltd., Chengdu (CN); BOE TECHNOLOGY GROUP CO., LTD., Beijing (CN)

(72) Inventors: Tao Qiu, Beijing (CN); Xi Yang, Beijing (CN); Cunkang Liao, Beijing (CN); Yudan Yang, Beijing (CN); Chao Xie, Beijing (CN)

(73) Assignees: CHENGDU BOE DISPLAY SCI-TECH CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 510 days.

(21) Appl. No.: 18/025,552

(22) PCT Filed: Apr. 19, 2022

(86) PCT No.: PCT/CN2022/087725
§ 371 (c)(1),
(2) Date: Mar. 9, 2023

(87) PCT Pub. No.: WO2023/201528
PCT Pub. Date: Oct. 26, 2023

(65) Prior Publication Data
US 2024/0297183 A1 Sep. 5, 2024

(51) Int. Cl.
*G02F 1/1362* (2006.01)
*H10D 86/40* (2025.01)

(52) U.S. Cl.
CPC .. *G02F 1/136263* (2021.01); *G02F 1/136272* (2021.01); *H10D 86/441* (2025.01)

(58) Field of Classification Search
CPC ........ G02F 1/136263; G02F 1/136272; H10D 86/441
See application file for complete search history.

(56) References Cited

U.S. PATENT DOCUMENTS

2004/0016925 A1 1/2004 Watamura
2005/0285989 A1* 12/2005 Sakurai ............. G02F 1/136259
349/44

FOREIGN PATENT DOCUMENTS

CN 101000412 A * 7/2007
CN 101813858 A 8/2010
(Continued)

*Primary Examiner* — Peter M Albrecht
(74) *Attorney, Agent, or Firm* — WHDA, LLP

(57) ABSTRACT

An array base plate includes a substrate base plate; a repairing line and data lines provided on one side of the substrate base plate, wherein the data lines include a first data line, the first data line has a first breaking point, and first data lines located on two sides of the first breaking point are individually connected to the repairing line; a first insulating layer provided on one side of the repairing line and the data lines that is opposite to the substrate base plate; and pixel electrodes provided on one side of the first insulating layer that is opposite to the substrate base plate, wherein the pixel electrodes include a first pixel electrode; the first data line is connected to the first pixel electrode; and orthographic projections on the substrate base plate of the repairing line and the first pixel electrode intersect or overlap.

15 Claims, 8 Drawing Sheets

(56) References Cited

FOREIGN PATENT DOCUMENTS

| CN | 109164613 | A | 1/2019 |
| CN | 110928087 | A | 3/2020 |

* cited by examiner

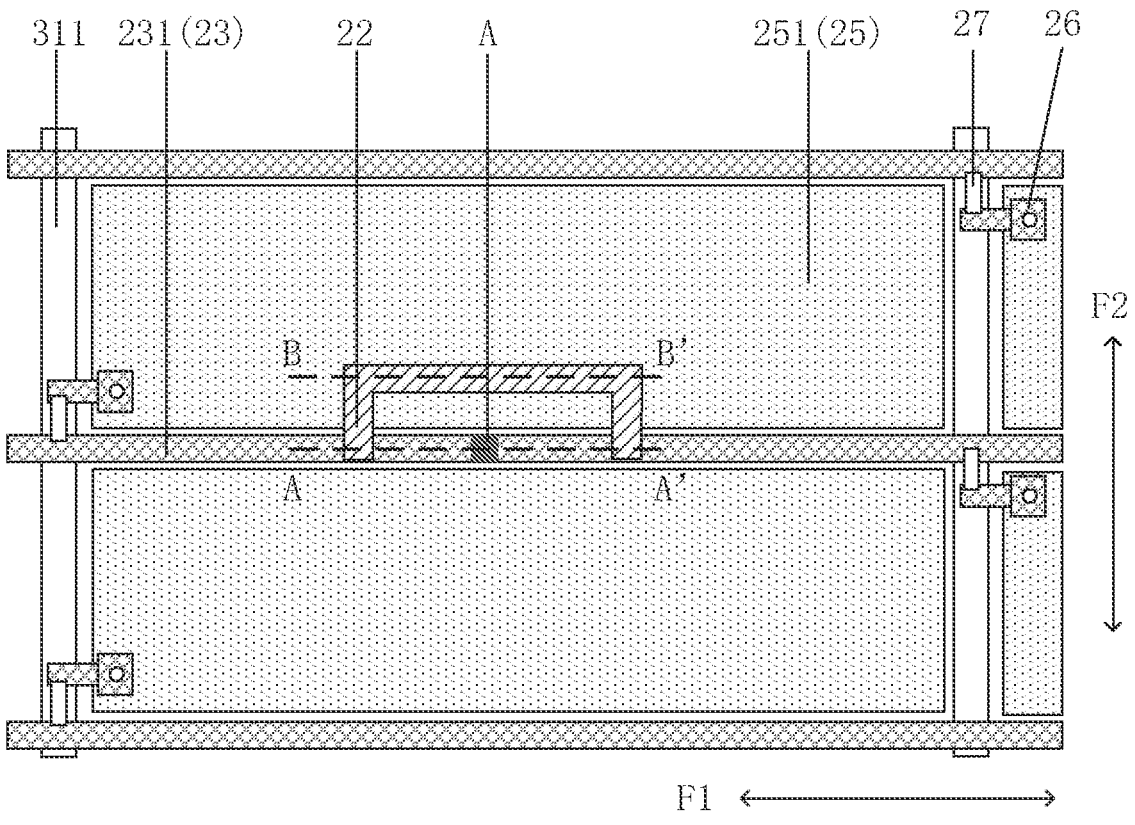
FIG. 2
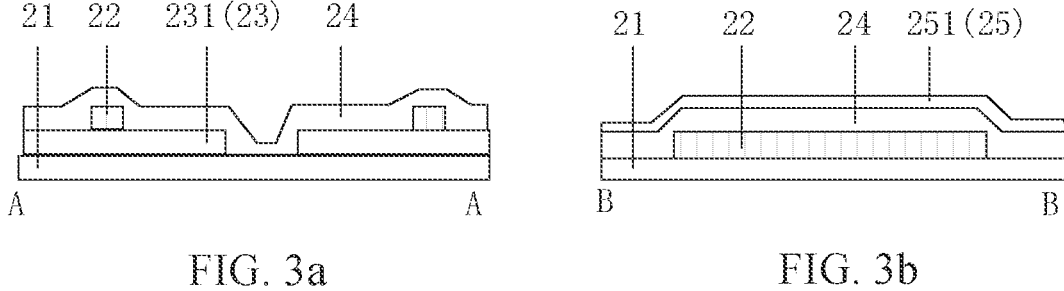
FIG. 3a                          FIG. 3b

ARRAY BASE PLATE AND FABRICATING METHOD THEREOF, DISPLAY PANEL AND DRIVING METHOD THEREOF, AND DISPLAYING DEVICE

TECHNICAL FIELD

The present disclosure relates to the technical field of displaying, and particularly relates to an array base plate and a fabricating method thereof, a display panel and a driving method thereof, and a displaying device.

BACKGROUND

The array base plate is one of the core components of liquid-crystal array base plates. The array base plate comprises grid lines and data lines that intersect. In the fabrication of the array base plate, open-circuit imperfects of the data lines might happen, whereby the data lines that open cannot normally transmit signals, which affects the normal displaying of the array base plate.

SUMMARY

The present disclosure provides an array base plate, wherein the array base plate comprises:

a substrate base plate;

a repairing line and a plurality of data lines that are provided on one side of the substrate base plate, wherein the plurality of data lines include a first data line, the first data line has a first breaking point, and first data lines located on two sides of the first breaking point are individually connected to the repairing line;

a first insulating layer provided on one side of the repairing line and the plurality of data lines that is opposite to the substrate base plate; and a plurality of pixel electrodes provided on one side of the first insulating layer that is opposite to the substrate base plate, wherein the plurality of pixel electrodes include a first pixel electrode;

the first data line is connected to the first pixel electrode, and is for transmitting a first voltage signal to the first pixel electrode; and an orthographic projection of the repairing line on the substrate base plate and an orthographic projection of the first pixel electrode on the substrate base plate intersect or overlap.

In an alternative implementation, the array base plate further comprises: a grid-line layer and a second insulating layer that are arranged in stack on one side of the substrate base plate, and the repairing line and the plurality of data lines are provided on one side of the second insulating layer that is opposite to the substrate base plate;

the grid-line layer comprises a plurality of grid lines, and orthographic projections of the grid lines on the substrate base plate and orthographic projections of the data lines on the substrate base plate intersect; and in a direction of extension of the first data line, a minimum distance between the first breaking point and the grid lines is greater than or equal to a preset threshold, the orthographic projection of the repairing line on the substrate base plate and orthographic projections of the plurality of pixel electrodes on the substrate base plate have an overlapping region therebetween, and the overlapping region is located within an area of the orthographic projection of the first pixel electrode on the substrate base plate.

In an alternative implementation, the array base plate further comprises: a grid-line layer and a second insulating layer that are arranged in stack on one side of the substrate base plate, and the repairing line and the plurality of data lines are provided on one side of the second insulating layer that is opposite to the substrate base plate;

the grid-line layer comprises a plurality of grid lines, and orthographic projections of the grid lines on the substrate base plate and orthographic projections of the data lines on the substrate base plate intersect;

the plurality of pixel electrodes further include a second pixel electrode, and the second pixel electrode is adjacent to the first pixel electrode in a direction of extension of the first data line; and in the direction of extension of the first data line, a minimum distance between the first breaking point and the grid lines is less than a preset threshold, the orthographic projection of the repairing line on the substrate base plate and the orthographic projection of the first pixel electrode on the substrate base plate intersect or overlap, and the orthographic projection of the repairing line on the substrate base plate and an orthographic projection of the second pixel electrode on the substrate base plate intersect or overlap.

In an alternative implementation, the first data line is connected to the second pixel electrode, and is further for transmitting a second voltage signal to the second pixel electrode.

In an alternative implementation, the plurality of data lines further include:

a second data line, connected to the second pixel electrode, and for transmitting a second voltage signal to the second pixel electrode; and a second breaking point is provided between the second pixel electrode and the second data line, wherein the second breaking point is for breaking transmission of the second voltage signal.

In an alternative implementation, the plurality of pixel electrodes further include a third pixel electrode, the third pixel electrode is adjacent to the second pixel electrode in a direction perpendicular to a direction of extension of the data lines, and the third pixel electrode and the first pixel electrode are located on different sides of the first data line; and the first data line is connected to the third pixel electrode, and is further for transmitting a third voltage signal to the third pixel electrode.

In an alternative implementation, the array base plate further comprises: a grid-line layer and a second insulating layer that are arranged in stack on one side of the substrate base plate, and the repairing line and the plurality of data lines are provided on one side of the second insulating layer that is opposite to the substrate base plate;

the grid-line layer comprises a first grid line, the first grid line and the first data line are short-circuited at an intersecting position, and an orthographic projection of the first grid line on the substrate base plate and the orthographic projection of the repairing line on the substrate base plate intersect; and the first data line has two instances of the first breaking point, the two first breaking points are located on different sides of the intersecting position, first data lines located on two sides of the two first breaking points are individually connected to the repairing line, a third breaking point is provided between the first data line located between the two first breaking points and the third pixel electrode, and the third breaking point is for breaking transmission of the third voltage signal.

In an alternative implementation, the array base plate further comprises a plurality of switching parts that are arranged in a same layer as the data lines and have a same material as a material of the data lines, and the pixel electrodes and the switching parts are connected by via holes provided in the first insulating layer;

the array base plate further comprises a thin-film-transistor array provided on one side of the substrate base plate, and the thin-film-transistor array comprises a plurality of thin-film transistors;

the thin-film-transistor array comprises:

a grid-line layer, a second insulating layer and a semiconductor layer that are arranged in stack on one side of the substrate base plate, and the repairing line and the plurality of data lines are provided on one side of the semiconductor layer that is opposite to the substrate base plate;

the grid-line layer comprises a plurality of grid lines, orthographic projections of the grid lines on the substrate base plate and orthographic projections of the data lines on the substrate base plate intersect, and the grid lines are further used as grids of the thin-film transistors;

the semiconductor layer comprises active layers of the thin-film transistors; and the data lines are further used as sources of the thin-film transistors, and the switching parts are further used as drains of the thin-film transistors.

In an alternative implementation, the preset threshold is greater than or equal to 25 micrometers.

In an alternative implementation, in a direction of extension of the first data line, a dimension of the repairing line is greater than or equal to 40 micrometers, and less than or equal to 80 micrometers.

In an alternative implementation, in a direction perpendicular to a direction of extension of the first data line, a dimension of the repairing line is greater than or equal to 10 micrometers, and less than or equal to 30 micrometers.

The present disclosure provides a display panel, wherein the display panel comprises the array base plate according to any one of the above embodiments.

The present disclosure provides a displaying device, wherein the displaying device comprises the display panel according to any one of the above embodiments.

The present disclosure provides a driving method of a display panel, applied to the display panel according to any one of the above embodiments, wherein the driving method comprises:

supplying voltage signals having opposite polarities to any two neighboring data lines among the plurality of data lines.

The present disclosure provides a fabricating method of an array base plate, wherein the method comprises:

providing a substrate base plate;

forming a repairing line and a plurality of data lines on one side of the substrate base plate, wherein the plurality of data lines include a first data line, the first data line has a first breaking point, and first data lines located on two sides of the first breaking point are individually connected to the repairing line;

forming a first insulating layer on one side of the repairing line and the plurality of data lines that is opposite to the substrate base plate; and forming a plurality of pixel electrodes on one side of the first insulating layer that is opposite to the substrate base plate, wherein the plurality of pixel electrodes include a first pixel electrode;

wherein the first data line is connected to the first pixel electrode, and is for transmitting a first voltage signal to the first pixel electrode; and an orthographic projection of the repairing line on the substrate base plate and an orthographic projection of the first pixel electrode on the substrate base plate intersect or overlap.

In an alternative implementation, before the step of forming the repairing line and the plurality of data lines on the one side of the substrate base plate, the method further comprises:

sequentially forming a grid-line layer and a second insulating layer on one side of the substrate base plate, wherein the grid-line layer comprises a plurality of grid lines, and orthographic projections of the grid lines on the substrate base plate and orthographic projections of the data lines on the substrate base plate intersect; and the step of forming the repairing line and the plurality of data lines on the one side of the substrate base plate comprises:

forming the plurality of data lines on one side of the second insulating layer that is opposite to the substrate base plate;

detecting the first breaking point; and according to a minimum distance between the first breaking point and the grid lines, forming the repairing line.

In an alternative implementation, the step of, according to the minimum distance between the first breaking point and the grid lines, forming the repairing line comprises:

if, in a direction of extension of the first data line, the minimum distance between the first breaking point and the grid lines is greater than or equal to a preset threshold, then forming the repairing line, wherein the orthographic projection of the repairing line on the substrate base plate and orthographic projections of the plurality of pixel electrodes on the substrate base plate have an overlapping region therebetween, and the overlapping region is located within an area of the orthographic projection of the first pixel electrode on the substrate base plate.

In an alternative implementation, the plurality of pixel electrodes further include a second pixel electrode, and the second pixel electrode is adjacent to the first pixel electrode in a direction of extension of the first data line; and the step of, according to the minimum distance between the first breaking point and the grid lines, forming the repairing line comprises:

if, in the direction of extension of the first data line, the minimum distance between the first breaking point and the grid lines is less than a preset threshold, then forming the repairing line, wherein the orthographic projection of the repairing line on the substrate base plate and the orthographic projection of the first pixel electrode on the substrate base plate intersect or overlap, and the orthographic projection of the repairing line on the substrate base plate and an orthographic projection of the second pixel electrode on the substrate base plate intersect or overlap.

In an alternative implementation, the plurality of data lines further include a second data line, and the second data line is connected to the second pixel electrode, and is for transmitting a second voltage signal to the second pixel electrode; and after the step of forming the plurality of pixel electrodes on the one side of the first insulating layer that is opposite to the substrate base plate, the method further comprises:

forming a second breaking point between the second pixel electrode and the second data line, wherein the second breaking point is for breaking transmission of the second voltage signal.

In an alternative implementation, the plurality of pixel electrodes further include a second pixel electrode and a third pixel electrode, the second pixel electrode is adjacent to the first pixel electrode in a direction of extension of the first data line, the third pixel electrode is adjacent to the second pixel electrode in a direction perpendicular to a direction of extension of the data lines, and the third pixel electrode and the first pixel electrode are located on different sides of the first data line;

the first data line is connected to the third pixel electrode, and is further for transmitting a third voltage signal to the third pixel electrode;

the plurality of data lines further include: a second data line, connected to the second pixel electrode, and for transmitting a second voltage signal to the second pixel electrode:

before the step of forming the repairing line and the plurality of data lines on the one side of the substrate base plate, the method further comprises:

sequentially forming a grid-line layer and a second insulating layer on one side of the substrate base plate, wherein the grid-line layer comprises a plurality of grid lines, orthographic projections of the grid lines on the substrate base plate and orthographic projections of the data lines on the substrate base plate intersect, and the plurality of grid lines include a first grid line;

the step of forming the repairing line and the plurality of data lines on the one side of the substrate base plate comprises:

forming the plurality of data lines on one side of the second insulating layer that is opposite to the substrate base plate;

detecting an intersecting position, wherein the first grid line and the first data line are short-circuited at the intersecting position;

forming the first breaking point at first data lines on two sides of the intersecting position, wherein in the direction of extension of the first data line, a minimum distance between the first breaking point and the grid lines is less than a preset threshold; and forming the repairing line, wherein the repairing line is connected to the first data lines located on two sides of two instances of the first breaking point, the orthographic projection of the repairing line on the substrate base plate and the orthographic projection of the first pixel electrode on the substrate base plate intersect or overlap, the orthographic projection of the repairing line on the substrate base plate and an orthographic projection of the second pixel electrode on the substrate base plate intersect or overlap, and an orthographic projection of the first grid line on the substrate base plate and the orthographic projection of the repairing line on the substrate base plate intersect; and after the step of forming the plurality of pixel electrodes on the one side of the first insulating layer that is opposite to the substrate base plate, the method further comprises:

forming a second breaking point between the second pixel electrode and the second data line, wherein the second breaking point is for breaking transmission of the second voltage signal; and forming a third breaking point between the first data line between the two first breaking points and the third pixel electrode, wherein the third breaking point is for breaking transmission of the third voltage signal.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the scales in the drawings are merely illustrative and do not indicate the actual scales.

FIG. 2 schematically shows a schematic planar structural diagram of the first type of array base plate according to the present disclosure;

FIG. 3a and FIG. 3b schematically show schematic sectional structural diagrams of the first type of array base plate according to the present disclosure;

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figures 1A, 1B, 1C:
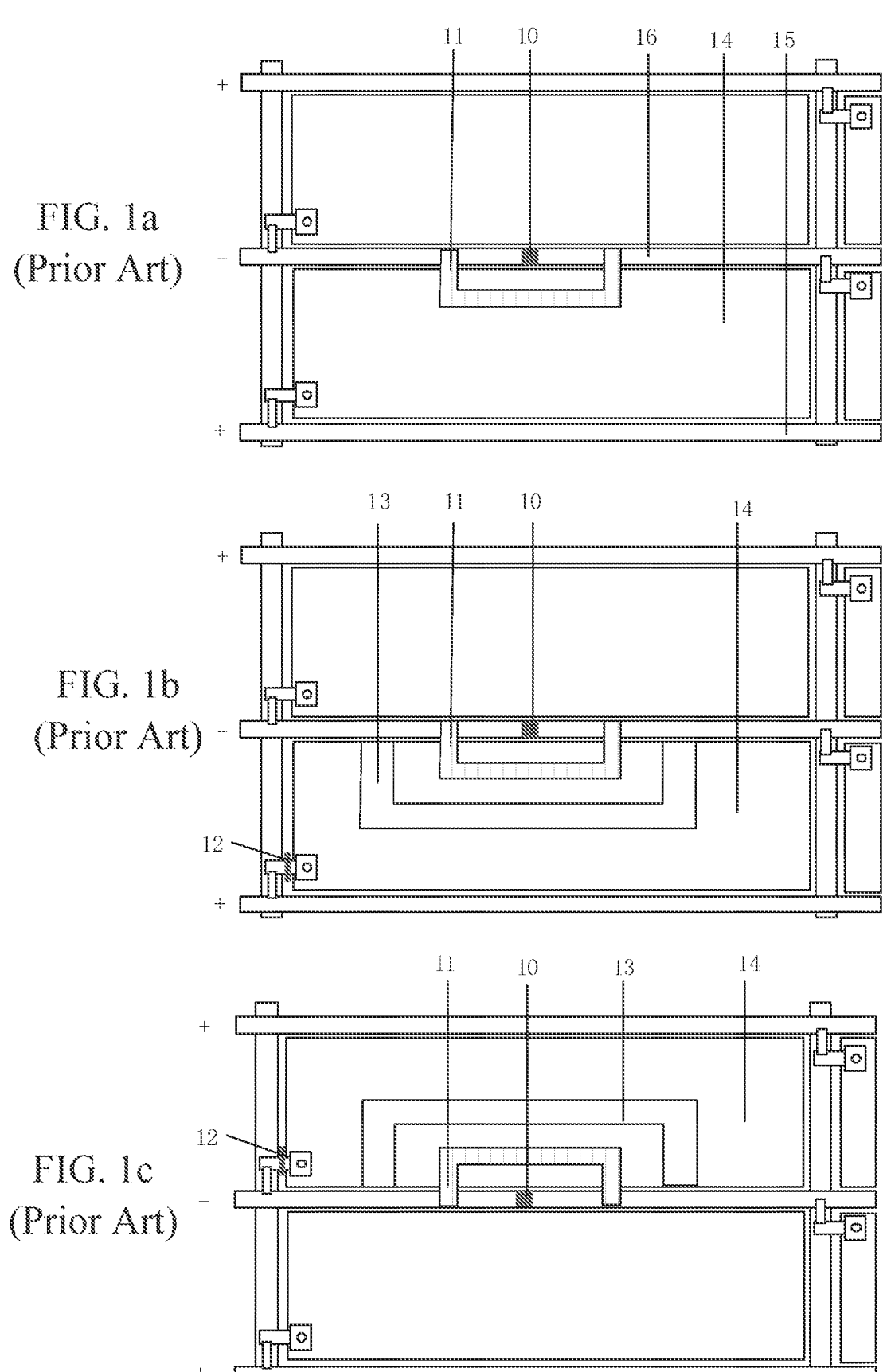
FIG. 1a, FIG. 1b and FIG. 1c schematically show schematic planar structural diagrams of several array base plates in the related art.

In the related art, as shown in FIG. 1a, FIG. 1b and FIG. 1c, when a data line has a breaking point 10, generally a repairing wire 11 is used to connect the data lines on the two sides of the breaking point 10, thereby realizing the connection of the data line. If the array base plate shown in FIG. 1a is used, in the subsequent lightening of the displaying module, a bright spot appears. Therefore, in order to eliminate the bright-spot imperfect, as shown in FIG. 1b and FIG. 1c, usually, in the pixel where the repairing wire 11 is located, the pixel electrode located within the separating region 13 is stripped, and the cutting region 12 is cut to disconnect the connection between the pixel electrode 14 and the data line, thereby causing the pixel point where the repairing wire 11 is located to be a black spot.

However, the step of cutting the cutting region 12 and stripping the pixel electrode within the separating region 13 occupies the cut-repairing device, which results in the reduction of the production capacity.

The inventor has analyzed the reason why the array base plate shown in FIG. 1a has the bright-spot imperfect. As shown in FIG. 1a, the pixel electrode 14 is the pixel electrode of the pixel where the repairing wire 11 is located, and the pixel electrode 14 and the repairing wire 11 intersect or overlap to form a coupling capacitor. The coupling capacitor can enable the pixel electrode 14 to induce an electric charge having the polarity opposite to the polarity of the electric charge in the repairing wire 11. The data line charging the pixel electrode 14 is a charging data line 15, and the data line connected to the repairing wire 11 is a coupling data line 16. Because the charging data line 15 and the coupling data line 16 are not the same one data line, when the polarity of the voltage in the charging data line 15 is positive, and the polarity of the voltage in the coupling data line 16 is negative, the induced electric charge in the pixel electrode 14 is positive, and the charging electric charge in the pixel electrode 14 is also positive. Therefore, the induced electric charge and the charging electric charge in the pixel electrode 14 are superposed, which results in overcharging of the pixel electrode 14. Therefore, in the subsequent lightening of the displaying module, the pixel point corresponding to the pixel electrode 14 is a bright spot.

In order to solve the above problems, the present disclosure provides an array base plate. Referring to FIGS. 2 and 4 to 7, FIGS. 2 and 4 to 7 individually schematically show a schematic planar structural diagram of an array base plate according to the present disclosure. Referring to FIG. 3a and FIG. 3b, FIG. 3a and FIG. 3b schematically show schematic sectional structural diagrams along AA' and along BB' of the array base plate shown in FIG. 2.

As shown in FIGS. 2 to 7, the array base plate comprises: a substrate base plate 21 (as shown in FIG. 3a and FIG. 3b); a repairing line 22 and a plurality of data lines 23 that are provided on one side of the substrate base plate 21, wherein the plurality of data lines 23 include a first data line 231, the first data line 231 has a first breaking point A, and the first data lines 231 located on the two sides of the first breaking point A are individually connected to the repairing line 22;

a first insulating layer 24 provided on the side of the repairing line 22 and the plurality of data lines 23 that is opposite to the substrate base plate 21 (as shown in FIG. 3a and FIG. 3b); and a plurality of pixel electrodes 25 provided on the side of the first insulating layer 24 that is opposite to the substrate base plate 21, wherein the plurality of pixel electrodes 25 include a first pixel electrode 251.

The first data line 231 is connected to the first pixel electrode 251, and is for transmitting a first voltage signal to the first pixel electrode 251. The orthographic projection of the repairing line 22 on the substrate base plate 21 and the orthographic projection of the first pixel electrode 251 on the substrate base plate 21 intersect or overlap.

The orthographic projection of the first pixel electrode 251 on the substrate base plate 21 and the orthographic projection of the repairing line 22 on the substrate base plate 21 intersect or overlap, and the overlapping region forms a coupling capacitor. Regarding the first pixel electrode 251, because the data line 23 for charging the first pixel electrode 251 and the data line 23 connected to the repairing line 22 are the same one data line, which is the first data line 231, and the provision of the coupling capacitor can enable the first pixel electrode 251 to induce an electric charge having the polarity opposite to the polarity of the electric charge in the repairing line 22, the induced electric charge in the first pixel electrode 251 and the charging electric charge supplied by the first data line 231 have opposite polarities, and the induced electric charge can offset part of the charging electric charge, which causes that the first pixel electrode 251 is undercharged.

Because the first pixel electrode 251 is undercharged, in the subsequent lightening of the displaying module, no matter whether the polarity of the voltage in the first data line 231 is positive or negative, the first pixel point corresponding to the first pixel electrode 251 is a low-grayscale dark spot, which eliminates the bright-spot imperfect. Therefore, in the array base plate according to the present disclosure, the connection between the first data line 231 and the first pixel electrode 251 is not required to be cut off, and the first pixel electrode 251 is not required to be stripped, which can reduce the occupation of a cut-repairing device, to increase the production capacity.

In practical applications, because the grade of the products having a black spot or bright spot in the displayed frame is lower than the grade of the products having a low-grayscale dark spot, when the array base plate according to the present disclosure is used, it is not required to degrade the subsequent displaying module, which can increase the yield of the product. It has been found by testing that, by using the array base plate according to the present disclosure, the yield of the displaying module can be increased by at least 0.15%.

Figure 4:
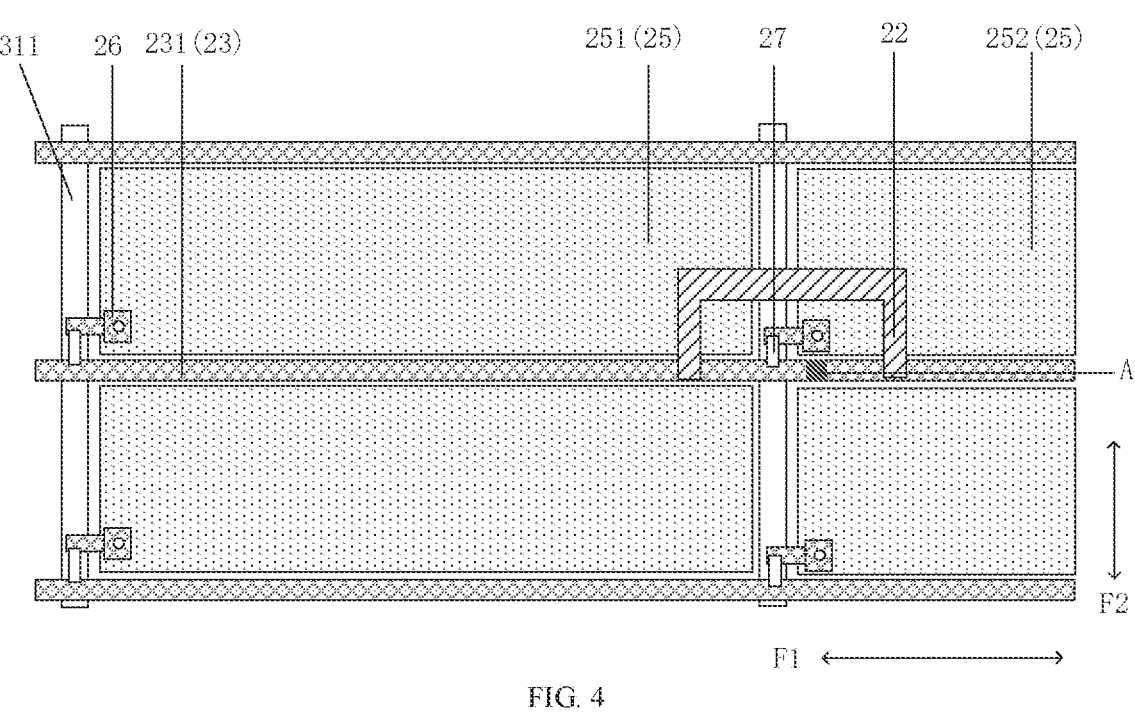
FIG. 4 schematically shows a schematic sectional structural diagram of the second type of array base plate according to the present disclosure.
Figure 5:
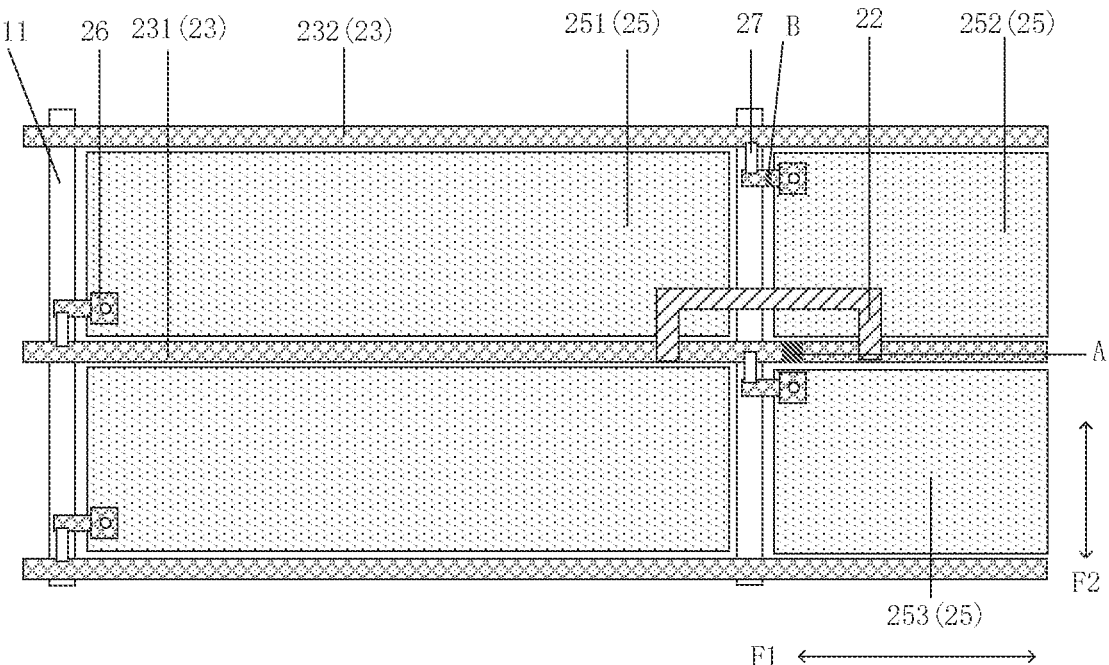
FIG. 5 schematically shows a schematic planar structural diagram of the third type of array base plate according to the present disclosure.
Figures 6, 7:
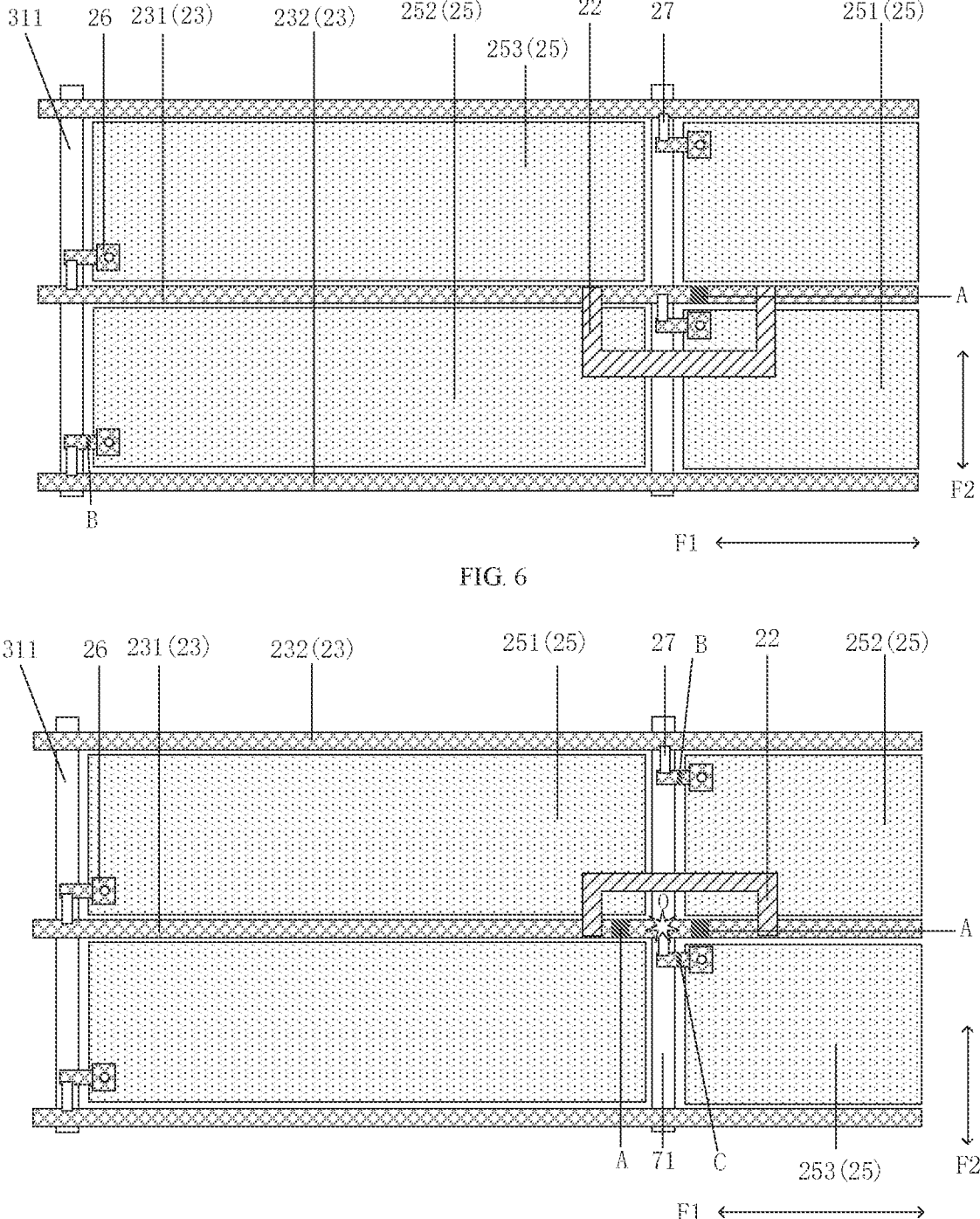
FIG. 6 schematically shows a schematic planar structural diagram of the fourth type of array base plate according to the present disclosure.
FIG. 7 schematically shows a schematic planar structural diagram of the fifth type of array base plate according to the present disclosure.
Figure 8:
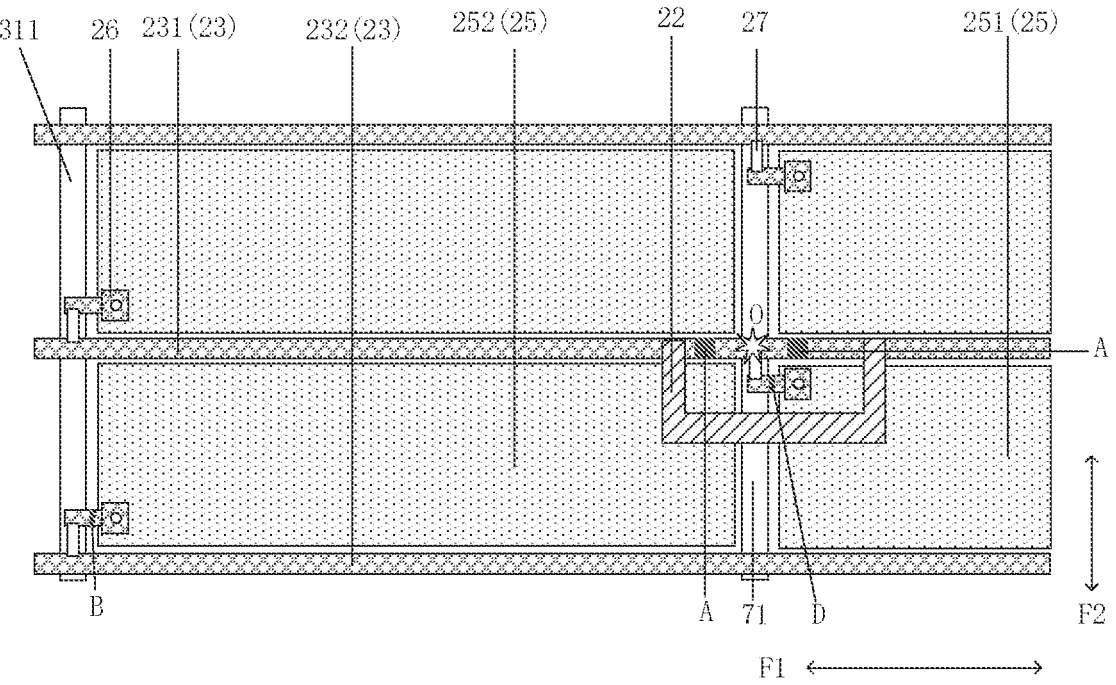
FIG. 8 schematically shows a schematic planar structural diagram of the sixth type of array base plate according to the present disclosure.

In the present disclosure, the first breaking point A may be a breaking point naturally formed in the fabricating process (as shown in FIGS. 2 to 6), and may also be a breaking point formed by laser cutting in order to repair other imperfects (as shown in FIG. 7 or 8), which is not limited in the present disclosure.

Optionally, the array base plate further comprises: a grid-line layer and a second insulating layer that are arranged in stack on one side of the substrate base plate 21, and the repairing line 22 and the plurality of data lines 23 are provided on the side of the second insulating layer that is opposite to the substrate base plate 21.

As shown in FIGS. 2 and 4 to 7, the grid-line layer comprises a plurality of grid lines 311, and the orthographic projections of the grid lines 311 on the substrate base plate 21 and the orthographic projections of the data lines 23 on the substrate base plate 21 intersect.

In a particular implementation, the particular position of the repairing line 22 may be determined according to the minimum distance between the first breaking point A and the grid lines 311.

For example, in an alternative implementation, as shown in FIG. 2, in the direction of extension F1 of the first data line 231, the minimum distance between the first breaking point A and the grid lines 311 is greater than or equal to a preset threshold, the orthographic projection of the repairing line 22 on the substrate base plate 21 and the orthographic projections of the plurality of pixel electrodes 25 on the substrate base plate 21 have an overlapping region therebetween, and the overlapping region is located within the area of the orthographic projection of the first pixel electrode 251 on the substrate base plate 21.

As shown in FIG. 2, because the first breaking point A and the grid line 311 have a high distance therebetween, the repairing line 22 can be located within the area of one pixel, and is not required to connect the first data line 231 by crossing the pixels or crossing the grid line 311. Therefore, in the present implementation, merely the pixel point corresponding to the first pixel electrode 251 is a low-grayscale dark spot, which can reduce the quantity of the imperfect pixel point, and improve the quality of the displayed frame.

In another alternative implementation, as shown in FIGS. 4 to 7, the plurality of pixel electrodes 25 may further include a second pixel electrode 252, and the second pixel electrode 252 is adjacent to the first pixel electrode 251 in the direction of extension F1 of the first data line 231.

In the present implementation, in the direction of extension F1 of the first data line 231, the minimum distance between the first breaking point A and the grid lines 311 is less than a preset threshold, the orthographic projection of the repairing line 22 on the substrate base plate 21 and the orthographic projection of the first pixel electrode 251 on the substrate base plate 21 intersect or overlap, and the orthographic projection of the repairing line 22 on the substrate base plate 21 and the orthographic projection of the second pixel electrode 252 on the substrate base plate 21 intersect or overlap.

As shown in FIGS. 4 to 7, because the first breaking point A has short distances from the grid lines 311, the repairing line 22 is located within the areas of two pixels, and the repairing line 22 is required to connect the first data line 231 by crossing the pixels or crossing the grid line 311. In other words, part of the repairing line 22 is located within the area of the pixel corresponding to the first pixel electrode 251, and the other part is located within the area of the pixel corresponding to the second pixel electrode 252.

In a particular implementation, the preset threshold may be preset according to practical demands. Optionally, the preset threshold is greater than or equal to 25 micrometers. For example, the preset threshold may be 30 micrometers, which is not limited in the present disclosure.

In a particular implementation, the first pixel electrode 251 and the second pixel electrode 252 may be connected to the same one data line, and may also be connected to different data lines.

In an example, as shown in FIG. 4, the first data line 231 may also be connected to the second pixel electrode 252, and the first data line 231 is further for transmitting a second voltage signal to the second pixel electrode 252.

As shown in FIG. 4, the orthographic projection of the repairing line 22 on the substrate base plate 21 and the orthographic projection of the first pixel electrode 251 on the substrate base plate 21 intersect or overlap, and the repairing line 22 and the first pixel electrode 251 form a first coupling capacitor. Because the data line 23 for charging the first pixel electrode 251 and the data line 23 connected to the repairing line 22 are the same one data line, which is the first data line 231, the provision of the first coupling capacitor causes the induced electric charge in the first pixel electrode 251 to have the polarity opposite to the polarity of the charging electric charge, and the induced electric charge can offset part of the charging electric charge, which causes that the first pixel electrode 251 is undercharged. Therefore, in the subsequent lightening of the displaying module, the first pixel point corresponding to the first pixel electrode 251 is a low-grayscale dark spot.

As shown in FIG. 4, the orthographic projection of the repairing line 22 on the substrate base plate 21 and the orthographic projection of the second pixel electrode 252 on the substrate base plate 21 intersect or overlap, and the repairing line 22 and the second pixel electrode 252 form a second coupling capacitor. Because the data line 23 for charging the second pixel electrode 252 and the data line 23 connected to the repairing line 22 are the same one data line, which is the first data line 231, the provision of the second coupling capacitor causes the induced electric charge in the second pixel electrode 252 to have the polarity opposite to the polarity of the charging electric charge, and the induced electric charge can offset part of the charging electric charge, which causes that the second pixel electrode 252 is undercharged. Therefore, in the subsequent lightening of the displaying module, the second pixel point corresponding to the second pixel electrode 252 is a low-grayscale dark spot.

In the present example, because the first pixel point corresponding to the first pixel electrode 251 is a low-grayscale dark spot, and the second pixel point corresponding to the second pixel electrode 252 is a low-grayscale dark spot, the connection between the first pixel electrode 251 and the first data line 231 is not required to be cut off, the connection between the second pixel electrode 252 and the first data line 231 is not required to be cut off, and the first pixel electrode 251 or the second pixel electrode 252 is not required to be stripped, which can increase the production capacity.

In the present example, because the neighboring first pixel electrode 251 and second pixel electrode 252 in the column direction (i.e., the direction of extension F1 of the first data line 231) are connected to the same one data line, the voltage signals in the first pixel electrode 251 and the second pixel electrode 252 have the same polarity. The present example may employ the driving in the frame-inversion mode or the driving in the column-inversion mode, which is not limited in the present disclosure.

In another example, as shown in FIGS. 5 to 7, the plurality of data lines 23 may further include a second data line 232, and the second data line 232 is connected to the second pixel electrode 252, and is for transmitting a second voltage signal to the second pixel electrode 252.

In the present example, the first pixel electrode 251 is connected to the first data line 231, and the second pixel electrode 252 is connected to the second data line 232. In other words, the neighboring first pixel electrode 251 and second pixel electrode 252 in the column direction are connected to different data lines, and, by supplying the voltage signals having different polarities to the first data line 231 and the second data line 232, it can be realized that the polarities of the voltage signals in the neighboring first pixel electrode 251 and second pixel electrode 252 in the column direction are opposite.

As shown in FIGS. 5 to 7, the orthographic projection of the repairing line 22 on the substrate base plate 21 and the orthographic projection of the first pixel electrode 251 on the substrate base plate 21 intersect or overlap, and the repairing line 22 and the first pixel electrode 251 form a first coupling capacitor. Because the data line 23 for charging the first pixel electrode 251 and the data line 23 connected to the repairing line 22 are the same one data line, which is the first data line 231, the provision of the first coupling capacitor causes the induced electric charge in the first pixel electrode 251 to have the polarity opposite to the polarity of the charging electric charge, and the induced electric charge can offset part of the charging electric charge, which causes that the first pixel electrode 251 is undercharged. Therefore, in the subsequent lightening of the displaying module, the first pixel point corresponding to the first pixel electrode 251 is a low-grayscale dark spot.

As shown in FIGS. 5 to 7, the orthographic projection of the repairing line 22 on the substrate base plate 21 and the orthographic projection of the second pixel electrode 252 on the substrate base plate 21 intersect or overlap, and the repairing line 22 and the second pixel electrode 252 form a second coupling capacitor. Because the data line 23 for charging the second pixel electrode 252 (i.e., the second data line 232) and the data line 23 connected to the repairing line 22 (i.e., the first data line 231) are not the same one data line, the provision of the second coupling capacitor can enable the second pixel electrode 252 to induce an electric charge having the polarity opposite to the polarity of the electric charge in the repairing line 22. When the voltage signals in the first data line 231 and the second data line 232 have opposite polarities, the induced electric charge in the second pixel electrode 252 has the same polarity as the polarity of the charging electric charge, and the induced electric charge and the charging electric charge are superposed, which causes that the second pixel electrode 252 is overcharged. Therefore, in the subsequent lightening of the displaying module, the second pixel point corresponding to the second pixel electrode 252 is a bright spot.

Therefore, in order to eliminate the bright spot, optionally, as shown in FIGS. 5 to 7, a second breaking point B may be provided between the second pixel electrode 252 and the second data line 232, and the second breaking point B is for breaking the transmission of the second voltage signal.

By providing the second breaking point B, the signal transmission between the second pixel electrode 252 and the second data line 232 is cut off, which can cause the pixel point where the second pixel electrode 252 is located to be a dark spot, which eliminates the bright-spot imperfect.

Optionally, the array base plate may further comprise a plurality of switching parts 26 that are arranged in the same layer as the data lines 23 and have the same material as the material of the data lines 23, and the pixel electrodes 25 and the switching parts 26 are connected by via holes provided in the first insulating layer 24. In such a case, the second breaking point B may be located at the switching part 26 connecting the second pixel electrode 252 and the second data line 232.

In addition, in FIGS. 5 to 7, the second pixel electrode 252 is not required to be stripped subsequently, which can increase the production capacity.

It should be noted that, in FIGS. 5 to 7, the voltage signals in the first data line 231 and the second data line 232 may also have the same polarity. In such a case, because both of the pixel points corresponding to the first pixel electrode 251 and the second pixel electrode 252 are a low-grayscale dark spot, the connection between the first pixel electrode 251 and the first data line 231 is not required to be cut off, the connection between the second pixel electrode 252 and the first data line 231 is not required to be cut off, and the first pixel electrode 251 or the second pixel electrode 252 is not required to be stripped, which can increase the production capacity.

Optionally, as shown in FIGS. 5 to 7, the plurality of pixel electrodes 25 may further include a third pixel electrode 253, the third pixel electrode 253 is adjacent to the second pixel electrode 252 in the direction F2 perpendicular to the direction of extension of the data lines 23, and the third pixel electrode 253 and the first pixel electrode 251 are located on different sides of the first data line 231. The second pixel electrode 252 and the first pixel electrode 251 are located on the same one side of the first data line 231.

The first data line 231 may also be connected to the third pixel electrode 253, and is further for transmitting a third voltage signal to the third pixel electrode 253.

In the present example, the first data line 231 and the second data line 232 may be supplied with voltage signals having opposite polarities, whereby the voltage signals in the first pixel electrode 251 and the second pixel electrode 252 have opposite polarities, and the voltage signals in the third pixel electrode 253 and the second pixel electrode 252 have opposite polarities. The present example may employ the driving in the spot-inversion mode, to improve the quality of displaying of the displayed frame.

Optionally, the array base plate further comprises: a grid-line layer and a second insulating layer that are arranged in stack on one side of the substrate base plate 21, and the repairing line 22 and the plurality of data lines 23 are provided on the side of the second insulating layer that is opposite to the substrate base plate 21.

As shown in FIG. 7 or 8, the grid-line layer may comprise a first grid line 71, the first grid line 71 and the first data line 231 are short-circuited at an intersecting position O, and the orthographic projection of the first grid line 71 on the substrate base plate 21 and the orthographic projection of the repairing line 22 on the substrate base plate 21 intersect.

In such a case, the first data line 231 may have two first breaking points A, the two first breaking points A are located on different sides of the intersecting position O, and first data lines 231 located on the two sides of the two first breaking points A are individually connected to the repairing line 22.

The two first breaking points A are used to break the transmission of the signal in the first grid line 71 via the short-circuited point to the first data line 231 on the two sides of the short-circuited point, to ensure the normal displaying of the frame.

In FIG. 7, the third pixel electrode 253 is connected to the first data line 231 located between the two first breaking points A, and the first data line 231 located between the two first breaking points A is short-circuited to the first grid line 71, which might cause abnormal displaying of the third pixel point corresponding to the third pixel electrode 253.

In order to prevent abnormal displaying of the third pixel point, optionally, a third breaking point C is provided between the first data line 231 located between the two first breaking points A and the third pixel electrode 253, and the third breaking point C is for breaking the transmission of the third voltage signal. The third breaking point C may be located at the switching part 26 connecting the third pixel electrode 253 and the first data line 231.

By providing the third breaking point C, the signal transmission between the third pixel electrode 253 and the first data line 231 is cut off, which can cause the pixel point where the third pixel electrode 253 is located to be a dark spot, to prevent abnormal displaying of that pixel point. In a particular implementation, the third pixel electrode 253 is not required to be stripped.

In FIG. 8, the first pixel electrode 251 is connected to the first data line 231 located between the two first breaking points A, and the first data line 231 located between the two first breaking points A is short-circuited to the first grid line 71, which might cause abnormal displaying of the first pixel point corresponding to the first pixel electrode 251.

In order to prevent abnormal displaying of the first pixel point, optionally, a fourth breaking point D is provided between the first data line 231 located between the two first breaking points A and the first pixel electrode 251, and the fourth breaking point D is for breaking the transmission of the first voltage signal. The fourth breaking point D may be located at the switching part 26 connecting the first pixel electrode 251 and the first data line 231

By providing the fourth breaking point D, the signal transmission between the first pixel electrode 251 and the first data line 231 is cut off, which can cause the pixel point where the first pixel electrode 251 is located to be a dark spot, to prevent abnormal displaying of that pixel point. In a particular implementation, the first pixel electrode 251 is not required to be stripped.

In FIG. 7, the second pixel electrode 252 and the third pixel electrode 253, as dark spots, are arranged in the direction of extension of the first grid line 71 (the direction F2 shown in the figure). Because the pixel electrodes 25 have lower dimensions in the direction of extension of the first grid line 71, and the second pixel electrode 252 and the third pixel electrode 253 might correspond to two sub-pixels of the same one pixel, that has a lower influence on the effect of displaying. However, in FIG. 8, the second pixel electrode 252 and the third pixel electrode 253, as dark spots, are arranged in the direction of extension of the data line 23 (the direction F1 shown in the figure). Because the pixel electrodes 25 have higher dimensions in the direction of extension of the data line 23, and the second pixel electrode 252 and the third pixel electrode 253 are located in different pixels, that has a higher influence on the effect of displaying. Therefore, by using the array base plate shown in FIG. 7, the quality of displaying can be further improved, to improve the product yield.

Optionally, the array base plate may further comprise a plurality of switching parts 26 that are arranged in the same layer as the data lines 23 and have the same material as the material of the data lines 23, and the pixel electrodes 25 and the switching parts 26 are connected by via holes provided in the first insulating layer 24. The array base plate may further comprise a thin-film-transistor array provided on one side of the substrate base plate 21, and the repairing line 22 and the plurality of data lines 23 are provided on the side of the thin-film-transistor array that is opposite to the substrate base plate 21. The thin-film-transistor array comprises a plurality of thin-film transistors.

The thin-film-transistor array comprises: a grid-line layer, a second insulating layer and a semiconductor layer that are arranged in stack on one side of the substrate base plate 21, and the repairing line 22 and the plurality of data lines 23 are provided on the side of the semiconductor layer that is opposite to the substrate base plate 21.

Referring to FIG. 2, the grid-line layer may comprise a plurality of grid lines 311, the orthographic projections of the grid lines 311 on the substrate base plate 21 and the orthographic projections of the data lines 23 on the substrate base plate 21 intersect, and the grid lines 311 are further used as the grids of the thin-film transistors. The semiconductor layer comprises the active layers 27 of the thin-film transistors. The data lines 23 are further used as the sources of the thin-film transistors, and the switching parts 26 are further used as the drains of the thin-film transistors.

In a particular implementation, as shown in FIG. 2, the orthographic projection of the active layer 27 on the substrate base plate 21 may be located within the area of the orthographic projections of the grid lines 311 on the substrate base plate 21, the orthographic projection of the active layer 27 on the substrate base plate 21 and the orthographic projection of the data line 23 on the substrate base plate 21 intersect or overlap, and the orthographic projection of the active layer 27 on the substrate base plate 21 and the orthographic projection of the switching part 26 on the substrate base plate 21 intersect or overlap.

Optionally, the material of the repairing line 22 comprises tungsten. For example, the material of the repairing line 22 may comprise tungsten hexacarbonyl and so on, which is not limited in the present disclosure.

Optionally, in the direction of extension F1 of the first data line 231, the dimension of the repairing line 22 is greater than or equal to 40 micrometers, and less than or equal to 80 micrometers.

For example, in the direction of extension F1 of the first data line 231, the dimension of the repairing line 22 may be 50 micrometers (as shown in FIG. 2), or 75 micrometers (as shown in FIGS. 4 to 8), which is not limited in the present disclosure.

Optionally, in the direction F2 perpendicular to the direction of extension of the first data line 231, the dimension of the repairing line 22 is greater than or equal to 10 micrometers, and less than or equal to 30 micrometers. Optionally, in the direction F2 perpendicular to the direction of extension of the first data line 231, the dimension of the repairing line 22 may be greater than or equal to 15 micrometers, and less than or equal to 25 micrometers, which is not limited in the present disclosure.

The present disclosure provides a display panel, wherein the display panel comprises the array base plate according to any one of the above embodiments.

Because the display panel comprises the above-described array base plate, a person skilled in the art can understand that the display panel has the advantages of the array base plate according to the present disclosure, which is not discussed herein further.

The present disclosure provides a displaying device, wherein the displaying device comprises the display panel according to any one of the above embodiments.

Because the displaying device comprises the above-described array base plate, a person skilled in the art can understand that the displaying device has the advantages of the array base plate according to the present disclosure, which is not discussed herein further.

It should be noted that the displaying device according to the present embodiment may be any products or components that have the function of 2D or 3D displaying, such as an electronic paper, a mobile phone, a tablet personal computer, a TV set, a notebook computer, a digital photo frame, a virtual-reality device, an augmented-reality device, an under-screen-camera device and a navigator.

The present disclosure provides a driving method of a display panel, applied to the display panel according to any one of the above embodiments. Referring to FIGS. 2 to 8, the driving method comprises: supplying voltage signals having opposite polarities to any two neighboring data lines 23 among the plurality of data lines 23.

Referring to FIGS. 2 to 8, when the plurality of data lines 23 include neighboring first data line 231 and second data line 232, the first data line 231 and the second data line 232 may be supplied with voltage signals having opposite polarities.

Particularly, at the current frame, the voltage signal in the first data line 231 is a high-level voltage signal, and accordingly the voltage signal in the second data line 232 is a low-level voltage signal. At the next frame, the voltage signal in the first data line 231 may be a low-level voltage signal, and accordingly the voltage signal in the second data line 232 may be a high-level voltage signal.

The high-level voltage signal and the low-level voltage signal are used to cause the liquid-crystal molecules to deflect in different directions.

Referring to FIG. 4, when the plurality of pixel electrodes 25 include the first pixel electrode 251 and the second pixel electrode 252, the first pixel electrode 251 and the second pixel electrode 252 are adjacent in the direction of extension F1 of the first data line 231, and both of the first pixel electrode 251 and the second pixel electrode 252 are connected to the first data line 231, by supplying voltage signals having opposite polarities to any two neighboring data lines 23, column-inversion driving can be realized, to improve the effect of displaying of the frame.

Referring to FIGS. 2 and 5 to 7, when the plurality of pixel electrodes 25 include the first pixel electrode 251, the second pixel electrode 252 and the third pixel electrode 253, the first pixel electrode 251 and the second pixel electrode 252 are adjacent in the direction of extension F1 of the first data line 231, the second pixel electrode 252 and the third pixel electrode 253 are adjacent in the direction F2 perpendicular to the direction of extension of the first data line 231, both of the first pixel electrode 251 and the third pixel electrode 253 are connected to the first data line 231, and the second pixel electrode 252 is connected to the second data line 232, by supplying voltage signals having opposite polarities to the first data line 231 and the second data line 232, spot-inversion driving can be realized, to improve the effect of displaying of the frame.

The present disclosure provides a fabricating method of an array base plate, wherein the fabricating method comprises:

Step S01: providing a substrate base plate 21; and

Step S02: forming a repairing line 22 and a plurality of data lines 23 on one side of the substrate base plate 21, wherein the plurality of data lines 23 include a first data line 231, the first data line 231 has a first breaking point A, and the first data lines 231 located on the two sides of the first breaking point A are individually connected to the repairing line 22.

Step S03: forming a first insulating layer 24 on the side of the repairing line 22 and the plurality of data lines 23 that is opposite to the substrate base plate 21.

Step S04: forming a plurality of pixel electrodes 25 on the side of the first insulating layer 24 that is opposite to the substrate base plate 21, wherein the plurality of pixel electrodes 25 include a first pixel electrode 251.

The first data line 231 is connected to the first pixel electrode 251, and is for transmitting a first voltage signal to the first pixel electrode 251. The orthographic projection of the repairing line 22 on the substrate base plate 21 and the orthographic projection of the first pixel electrode 251 on the substrate base plate 21 intersect or overlap.

By using the fabricating method according to the present disclosure, the array base plate according to any one of the above embodiments can be fabricated.

The first breaking point A may be a breaking point naturally formed in the fabricating process (as shown in FIGS. 2 to 6), and may also be a breaking point formed by laser cutting in order to repair other imperfects (as shown in FIG. 7 or 8), which is not limited in the present disclosure.

In the first implementation, before the step S02, the method may further comprise:

Step S10: sequentially forming a grid-line layer and a second insulating layer on one side of the substrate base plate 21, wherein the grid-line layer comprises a plurality of grid lines 311, and the orthographic projections of the grid lines 311 on the substrate base plate 21 and the orthographic projections of the data lines 23 on the substrate base plate 21 intersect.

Correspondingly, the step S02 may particularly comprise:

Step S11: forming the plurality of data lines 23 on the side of the second insulating layer that is opposite to the substrate base plate 21.

Step S12: detecting the first breaking point A.

In a particular implementation, the first breaking point A may be detected by using an electrical testing device or an optical detecting device.

Step S13: According to the minimum distance between the first breaking point A and the grid lines 311, forming the repairing line 22.

Optionally, the step S13 may further comprise: if, in the direction of extension F1 of the first data line 231, the minimum distance between the first breaking point A and the grid lines 311 is greater than or equal to a preset threshold, then forming the repairing line 22, wherein the orthographic projection of the repairing line 22 on the substrate base plate 21 and the orthographic projections of the plurality of pixel electrodes 25 on the substrate base plate 21 have an overlapping region therebetween, and the overlapping region is located within the area of the orthographic projection of the first pixel electrode 251 on the substrate base plate 21, as shown in FIG. 2.

Figures 9A, 9B, 9C:
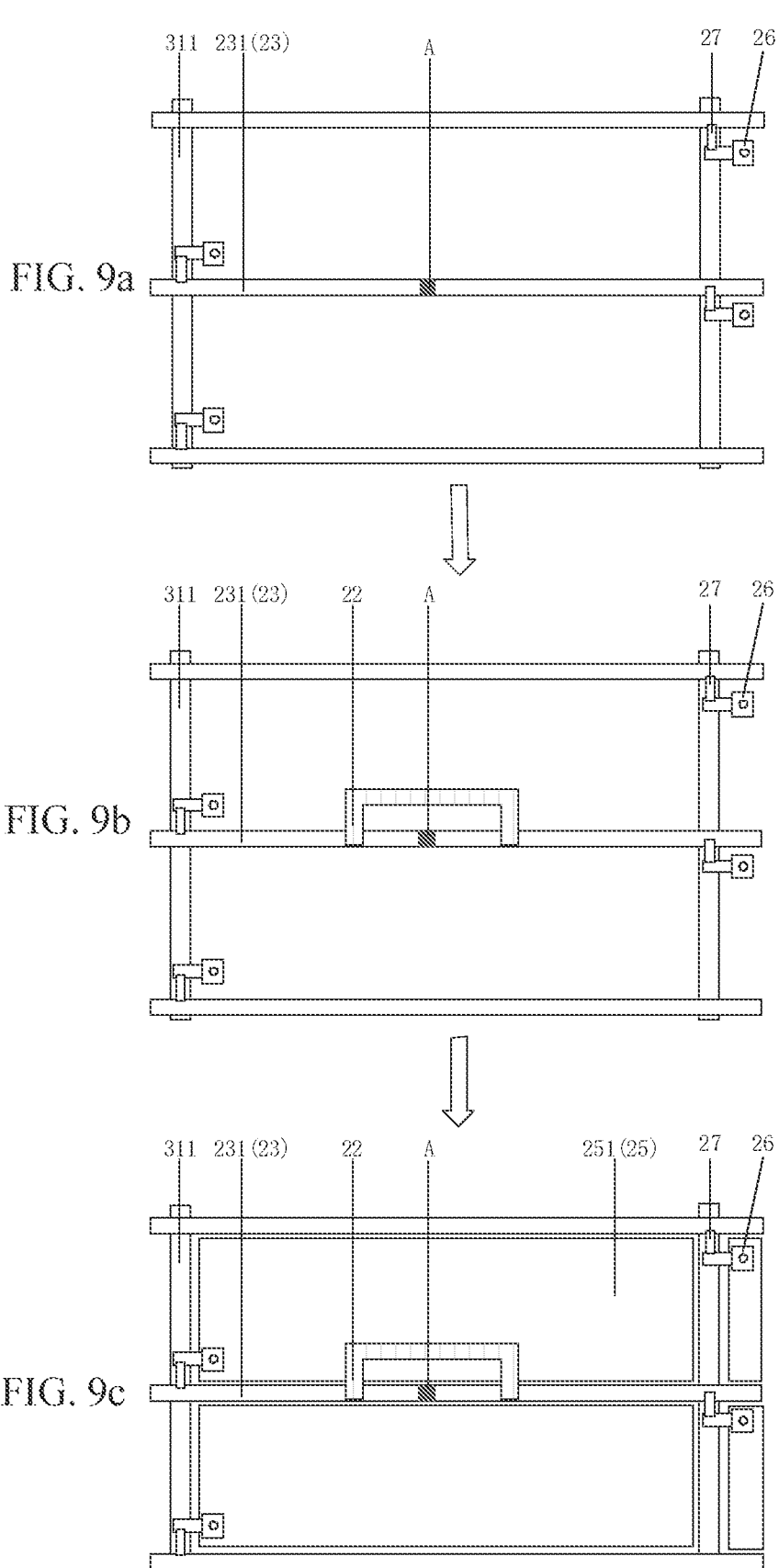
FIG. 9a, FIG. 9b and FIG. 9c schematically show schematic diagrams of the fabricating process of the first type of array base plate according to the present disclosure.

Referring to FIG. 9a. FIG. 9b and FIG. 9c, FIG. 9a, FIG. 9b and FIG. 9c show schematic diagrams of the fabricating process of the array base plate shown in FIG. 2, wherein FIG. 9a is a schematic planar structural diagram of the array base plate after the step S11 or the step S12 has been completed: FIG. 9b is a schematic planar structural diagram of the array base plate after the step S13 has been completed: and FIG. 9c is a schematic planar structural diagram of the array base plate after the step S03 and the step S04 have been completed.

When the plurality of pixel electrodes 25 further comprise the second pixel electrode 252, and the second pixel electrode 252 is adjacent to the first pixel electrode 251 in the direction of extension F1 of the first data line 231, optionally, the step S13 may further comprise:

if, in the direction of extension F1 of the first data line 231, the minimum distance between the first breaking point A and the grid lines 311 is less than a preset threshold, then forming the repairing line 22, wherein the orthographic projection of the repairing line 22 on the substrate base plate 21 and the orthographic projection of the first pixel electrode 251 on the substrate base plate 21 intersect or overlap, and the orthographic projection of the repairing line 22 on the substrate base plate 21 and the orthographic projection of the second pixel electrode 252 on the substrate base plate 21 intersect or overlap, as shown in FIGS. 4 to 6.

In an example, as shown in FIG. 4, the first data line 231 may also be connected to the second pixel electrode 252, and the first data line 231 is further for transmitting a second voltage signal to the second pixel electrode 252. In the present example, because the first pixel point corresponding to the first pixel electrode 251 is a low-grayscale dark spot, and the second pixel point corresponding to the second pixel electrode 252 is a low-grayscale dark spot, the connection between the first pixel electrode 251 and the first data line 231 is not required to be cut off, the connection between the second pixel electrode 252 and the first data line 231 is not required to be cut off, and the first pixel electrode 251 or the second pixel electrode 252 is not required to be stripped, which can increase the production capacity.

In another example, the plurality of data lines 23 further include a second data line 232, and the second data line 232 is connected to the second pixel electrode 252, and is for transmitting a second voltage signal to the second pixel electrode 252. When the voltage signals in the first data line 231 and the second data line 232 have opposite polarities, the second pixel corresponding to the second pixel electrode 252 is a bright spot.

In order to eliminate the bright spot, after the step S04, the method may further comprise:

Step S14: forming a second breaking point B between the second pixel electrode 252 and the second data line 232, wherein the second breaking point B is for breaking the transmission of the second voltage signal, as shown in FIG. 5 or 6.

It should be noted that the voltage signals in the first data line 231 and the second data line 232 may also have the same polarity. In such a case, because both of the pixel points corresponding to the first pixel electrode 251 and the second pixel electrode 252 are a low-grayscale dark spot, the connection between the first pixel electrode 251 and the first data line 231 is not required to be cut off, the connection between the second pixel electrode 252 and the first data line 231 is not required to be cut off, and the first pixel electrode 251 or the second pixel electrode 252 is not required to be stripped, which can increase the production capacity.

Figures 10A, 10B, 10C, 10D:
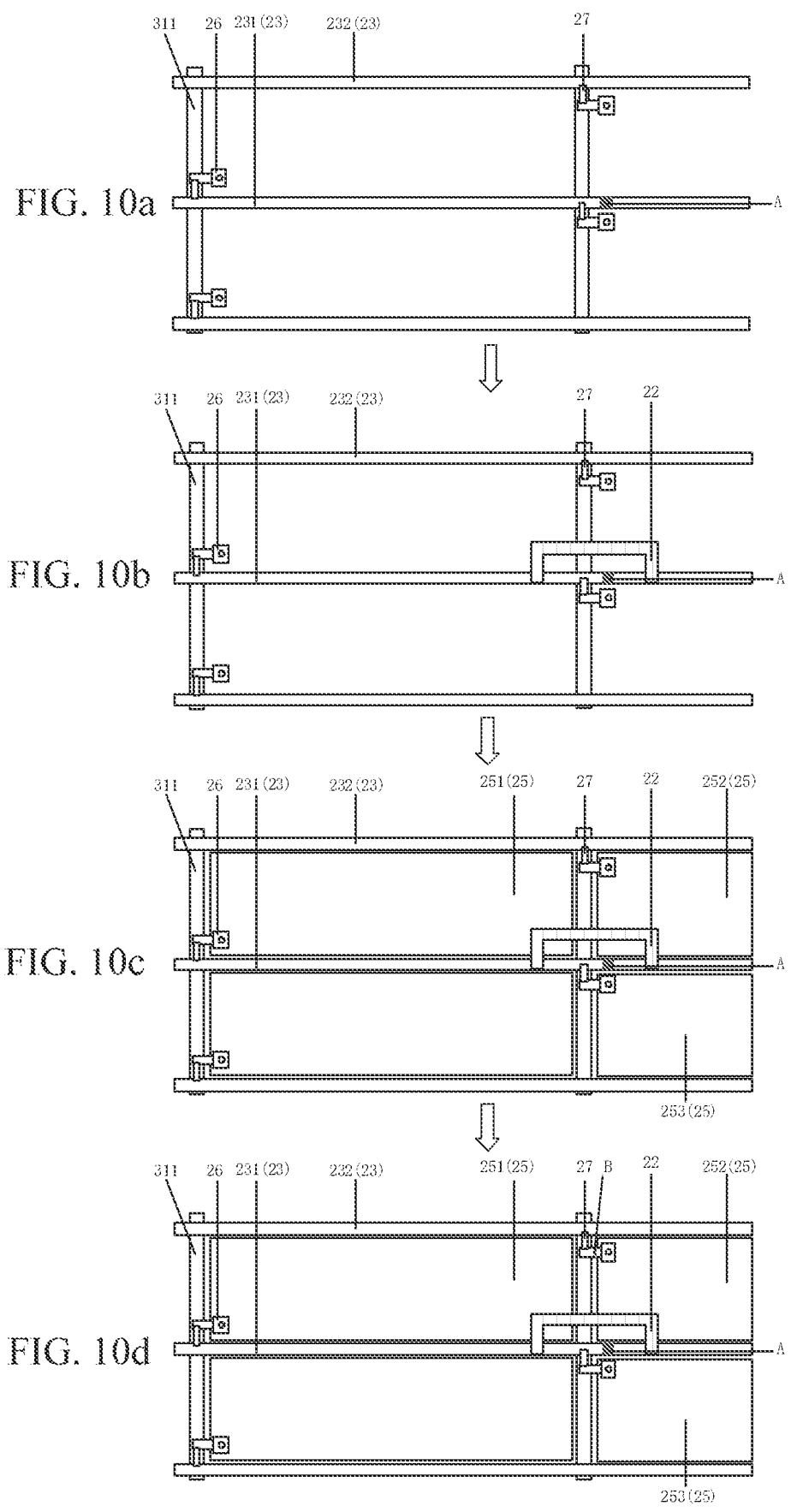
FIG. 10a, FIG. 10b, FIG. 10c and FIG. 10d schematically show schematic diagrams of the fabricating process of the third type of array base plate according to the present disclosure.

Referring to FIG. 10a, FIG. 10b, FIG. 10c and FIG. 10d, FIG. 10a, FIG. 10b. FIG. 10c and FIG. 10d show schematic diagrams of the fabricating process of the array base plate shown in FIG. 5, wherein FIG. 10a is a schematic planar structural diagram of the array base plate after the step S11 or the step S12 has been completed: FIG. 10b is a schematic planar structural diagram of the array base plate after the step S13 has been completed: FIG. 10c is a schematic planar structural diagram of the array base plate after the step S03 and the step S04 have been completed: and FIG. 10d is a schematic planar structural diagram of the array base plate after the step S14 has been completed.

In another alternative implementation, referring to FIG. 7, the plurality of pixel electrodes 25 further include a second pixel electrode 252 and a third pixel electrode 253, the second pixel electrode 252 is adjacent to the first pixel electrode 251 in the direction of extension F1 of the first data line 231, the third pixel electrode 253 is adjacent to the second pixel electrode 252 in the direction perpendicular to the direction of extension of the data lines 23, and the third pixel electrode 253 and the first pixel electrode 251 are located on different sides of the first data line 231. The first data line 231 is further connected to the third pixel electrode 253, and is further for transmitting a third voltage signal to the third pixel electrode 253. The plurality of data lines 23 further include: a second data line 232, connected to the second pixel electrode 252, and for transmitting a second voltage signal to the second pixel electrode 252. Before the step S02, the method may further comprise:

Step S20: sequentially forming a grid-line layer and a second insulating layer on one side of the substrate base plate 21, wherein the grid-line layer comprises a plurality of grid lines 311, the orthographic projections of the grid lines 311 on the substrate base plate 21 and the orthographic projections of the data lines 23 on the substrate base plate 21 intersect, and the plurality of grid lines 311 include a first grid line 71.

Correspondingly, the step S02 may particularly comprise:

Step S21: forming the plurality of data lines 23 on the side of the second insulating layer that is opposite to the substrate base plate 21.

This step may further comprise: forming a plurality of switching parts 26 on the side of the second insulating layer that is opposite to the substrate base plate 21. The switching parts 26 are arranged in the same layer as the data lines 23 and have the same material as the material of the data lines 23, and they may be synchronously formed. The switching parts 26 are connected to the pixel electrodes 25 by via holes provided in the first insulating layer 24.

Step S22: detecting an intersecting position O), wherein the first grid line 71 and the first data line 231 are short-circuited at the intersecting position O.

Step S23: forming the first breaking point A at the first data lines 231 on the two sides of the intersecting position O, wherein in the direction of extension F1 of the first data line 231, the minimum distance between the first breaking point A and the grid lines 311 is less than a preset threshold.

Step S24: forming the repairing line 22, wherein the repairing line 22 is connected to the first data lines 231 located on the two sides of the two first breaking points A, the orthographic projection of the repairing line 22 on the substrate base plate 21 and the orthographic projection of the first pixel electrode 251 on the substrate base plate 21 intersect or overlap, the orthographic projection of the repairing line 22 on the substrate base plate 21 and the orthographic projection of the second pixel electrode 252 on the substrate base plate 21 intersect or overlap, and the orthographic projection of the first grid line 71 on the substrate base plate 21 and the orthographic projection of the repairing line 22 on the substrate base plate 21 intersect.

After the step S04, the method may further comprise:

Step S25: forming a second breaking point B between the second pixel electrode 252 and the second data line 232, wherein the second breaking point B is for breaking the transmission of the second voltage signal.

Step S26: forming a third breaking point C between the first data line 231 between the two first breaking points A and the third pixel electrode 253, and the third breaking point C is for breaking the transmission of the third voltage signal.

Figures 11A, 11B, 11C, 11D:
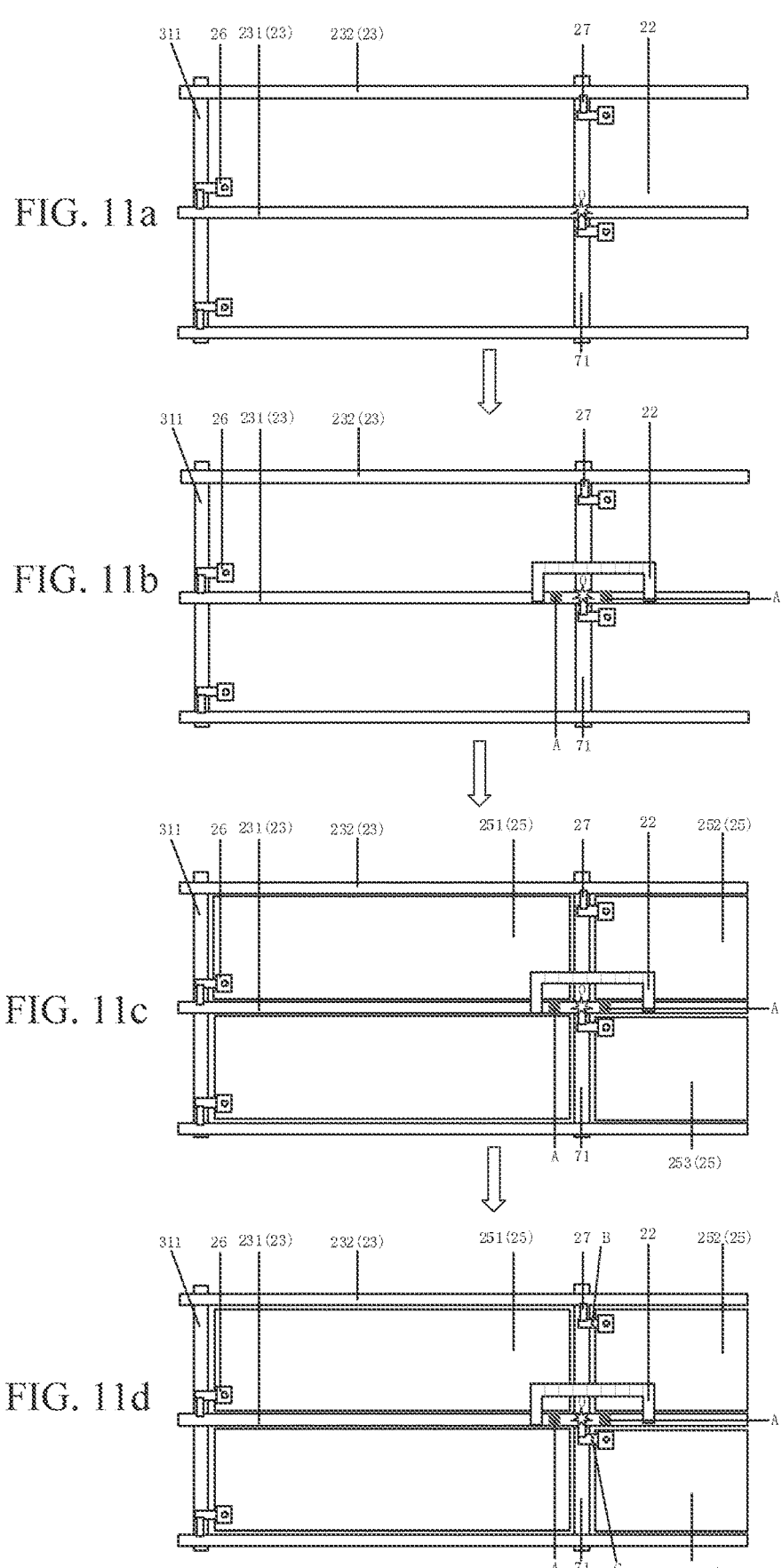
FIG. 11a, FIG. 11b, FIG. 11c and FIG. 11d schematically show schematic diagrams of the fabricating process of the fifth type of array base plate according to the present disclosure.

Referring to FIG. 11a, FIG. 11b, FIG. 11c and FIG. 11d, FIG. 11a, FIG. 11b, FIG. 11c and FIG. 11d show schematic diagrams of the fabricating process of the array base plate shown in FIG. 7, wherein FIG. 11a is a schematic planar structural diagram of the array base plate after the step S21 or the step S22 has been completed: FIG. 11b is a schematic planar structural diagram of the array base plate after the step S23 and the step S24 have been completed: FIG. 11c is a schematic planar structural diagram of the array base plate after the step S03 and the step S04 have been completed; and FIG. 11d is a schematic planar structural diagram of the array base plate after the step S25 and the step S26 have been completed.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The array base plate and the fabricating method thereof, the display panel and the driving method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. An array base plate, wherein the array base plate comprises:

a substrate base plate;

a repairing line and a plurality of data lines that are provided on one side of the substrate base plate, wherein the plurality of data lines include a first data line, the first data line has a first breaking point, and first data lines located on two sides of the first breaking point are individually connected to the repairing line;

a first insulating layer provided on one side of the repairing line and the plurality of data lines that is opposite to the substrate base plate; and a plurality of pixel electrodes provided on one side of the first insulating layer that is opposite to the substrate base plate, wherein the plurality of pixel electrodes include a first pixel electrode;

the first data line is connected to the first pixel electrode, and is for transmitting a first voltage signal to the first pixel electrode; and an orthographic projection of the repairing line on the substrate base plate and an orthographic projection of the first pixel electrode on the substrate base plate intersect or overlap;

wherein the array base plate further comprises: a grid-line layer and a second insulating layer that are arranged in stack on one side of the substrate base plate, and the repairing line and the plurality of data lines are provided on one side of the second insulating layer that is opposite to the substrate base plate;

the grid-line layer comprises a plurality of grid lines, and orthographic projections of the grid lines on the substrate base plate and orthographic projections of the data lines on the substrate base plate intersect;

the plurality of pixel electrodes further include a second pixel electrode, and the second pixel electrode is adjacent to the first pixel electrode in a direction of extension of the first data line; and in the direction of extension of the first data line, a minimum distance between the first breaking point and the grid lines is less than a preset threshold, the orthographic projection of the repairing line on the substrate base plate and the orthographic projection of the first pixel electrode on the substrate base plate intersect or overlap, and the orthographic projection of the repairing line on the substrate base plate and an orthographic projection of the second pixel electrode on the substrate base plate intersect or overlap.

2. The array base plate according to claim 1, wherein the first data line is connected to the second pixel electrode, and is further for transmitting a second voltage signal to the second pixel electrode.

3. The array base plate according to claim 1, wherein the plurality of data lines further include:

a second data line, connected to the second pixel electrode, and for transmitting a second voltage signal to the second pixel electrode; and a second breaking point is provided between the second pixel electrode and the second data line, wherein the second breaking point is for breaking transmission of the second voltage signal.

4. The array base plate according to claim 3, wherein the plurality of pixel electrodes further include a third pixel electrode, the third pixel electrode is adjacent to the second pixel electrode in a direction perpendicular to a direction of extension of the data lines, and the third pixel electrode and the first pixel electrode are located on different sides of the first data line; and the first data line is connected to the third pixel electrode, and is further for transmitting a third voltage signal to the third pixel electrode.

5. The array base plate according to claim 4, wherein the grid-line layer comprises a first grid line, the first grid line and the first data line are short-circuited at an intersecting position, and an orthographic projection of the first grid line on the substrate base plate and the orthographic projection of the repairing line on the substrate base plate intersect; and the first data line has two instances of the first breaking point, the two first breaking points are located on different sides of the intersecting position, first data lines located on two sides of the two first breaking points are individually connected to the repairing line, a third breaking point is provided between the first data line located between the two first breaking points and the third pixel electrode, and the third breaking point is for breaking transmission of the third voltage signal.

6. An array base plate, wherein the array base plate comprises:

a substrate base plate;

a repairing line and a plurality of data lines that are provided on one side of the substrate base plate, wherein the plurality of data lines include a first data line, the first data line has a first breaking point, and first data lines located on two sides of the first breaking point are individually connected to the repairing line;

a first insulating layer provided on one side of the repairing line and the plurality of data lines that is opposite to the substrate base plate; and a plurality of pixel electrodes provided on one side of the first insulating layer that is opposite to the substrate base plate, wherein the plurality of pixel electrodes include a first pixel electrode;

the first data line is connected to the first pixel electrode, and is for transmitting a first voltage signal to the first pixel electrode; and an orthographic projection of the repairing line on the substrate base plate and an orthographic projection of the first pixel electrode on the substrate base plate intersect or overlap;

wherein the array base plate further comprises a plurality of switching parts that are arranged in a same layer as the data lines and have a same material as a material of the data lines, and the pixel electrodes and the switching parts are connected by via holes provided in the first insulating layer;

the array base plate further comprises a thin-film-transistor array provided on one side of the substrate base plate, and the thin-film-transistor array comprises a plurality of thin-film transistors;

the thin-film-transistor array comprises:

a grid-line layer, a second insulating layer and a semiconductor layer that are arranged in stack on one side of the substrate base plate, and the repairing line and the plurality of data lines are provided on one side of the semiconductor layer that is opposite to the substrate base plate;

the grid-line layer comprises a plurality of grid lines, orthographic projections of the grid lines on the substrate base plate and orthographic projections of the data lines on the substrate base plate intersect, and the grid lines are further used as grids of the thin-film transistors;

the semiconductor layer comprises active layers of the thin-film transistors; and the data lines are further used as sources of the thin-film transistors, and the switching parts are further used as drains of the thin-film transistors.

7. The array base plate according to claim 1, wherein the preset threshold is greater than or equal to 25 micrometers.

8. The array base plate according to claim 1, wherein in a direction of extension of the first data line, a dimension of the repairing line is greater than or equal to 40 micrometers, and less than or equal to 80 micrometers.

9. The array base plate according to claim 1, wherein in a direction perpendicular to a direction of extension of the first data line, a dimension of the repairing line is greater than or equal to 10 micrometers, and less than or equal to 30 micrometers.

10. A display panel, wherein the display panel comprises the array base plate according to claim 1.

11. A displaying device, wherein the displaying device comprises the display panel according to claim 10.

12. A driving method of a display panel, applied to the display panel according to claim 10, wherein the driving method comprises:

supplying voltage signals having opposite polarities to any two neighboring data lines among the plurality of data lines.

13. A fabricating method of an array base plate, wherein the method comprises:

providing a substrate base plate;

forming a repairing line and a plurality of data lines on one side of the substrate base plate, wherein the plurality of data lines include a first data line, the first data line has a first breaking point, and first data lines located on two sides of the first breaking point are individually connected to the repairing line;

forming a first insulating layer on one side of the repairing line and the plurality of data lines that is opposite to the substrate base plate; and forming a plurality of pixel electrodes on one side of the first insulating layer that is opposite to the substrate base plate, wherein the plurality of pixel electrodes include a first pixel electrode;

wherein the first data line is connected to the first pixel electrode, and is for transmitting a first voltage signal to the first pixel electrode; and an orthographic projection of the repairing line on the substrate base plate and an orthographic projection of the first pixel electrode on the substrate base plate intersect or overlap;

wherein before the step of forming the repairing line and the plurality of data lines on the one side of the substrate base plate, the method further comprises:

sequentially forming a grid-line layer and a second insulating layer on one side of the substrate base plate, wherein the grid-line layer comprises a plurality of grid lines, and orthographic projections of the grid lines on the substrate base plate and orthographic projections of the data lines on the substrate base plate intersect; and the step of forming the repairing line and the plurality of data lines on the one side of the substrate base plate comprises:

forming the plurality of data lines on one side of the second insulating layer that is opposite to the substrate base plate;

detecting the first breaking point; and according to a minimum distance between the first breaking point and the grid lines, forming the repairing line:

wherein the plurality of pixel electrodes further include a second pixel electrode, and the second pixel electrode is adjacent to the first pixel electrode in a direction of extension of the first data line; and the step of, according to the minimum distance between the first breaking point and the grid lines, forming the repairing line comprises:

if, in the direction of extension of the first data line, the minimum distance between the first breaking point and the grid lines is less than a preset threshold, then forming the repairing line, wherein the orthographic projection of the repairing line on the substrate base plate and the orthographic projection of the first pixel electrode on the substrate base plate intersect or overlap, and the orthographic projection of the repairing line on the substrate base plate and an orthographic projection of the second pixel electrode on the substrate base plate intersect or overlap.

14. The fabricating method according to claim 13, wherein the plurality of data lines further include a second data line, and the second data line is connected to the second pixel electrode, and is for transmitting a second voltage signal to the second pixel electrode; and after the step of forming the plurality of pixel electrodes on the one side of the first insulating layer that is opposite to the substrate base plate, the method further comprises:

forming a second breaking point between the second pixel electrode and the second data line, wherein the second breaking point is for breaking transmission of the second voltage signal.

15. The fabricating method according to claim 13, wherein the plurality of pixel electrodes further include a second pixel electrode and a third pixel electrode, the second pixel electrode is adjacent to the first pixel electrode in a direction of extension of the first data line, the third pixel electrode is adjacent to the second pixel electrode in a direction perpendicular to a direction of extension of the data lines, and the third pixel electrode and the first pixel electrode are located on different sides of the first data line;

the first data line is connected to the third pixel electrode, and is further for transmitting a third voltage signal to the third pixel electrode;

the plurality of data lines further include: a second data line, connected to the second pixel electrode, and for transmitting a second voltage signal to the second pixel electrode;

before the step of forming the repairing line and the plurality of data lines on the one side of the substrate base plate, the method further comprises:

sequentially forming a grid-line layer and a second insulating layer on one side of the substrate base plate, wherein the grid-line layer comprises a plurality of grid lines, orthographic projections of the grid lines on the substrate base plate and orthographic projections of the data lines on the substrate base plate intersect, and the plurality of grid lines include a first grid line;

the step of forming the repairing line and the plurality of data lines on the one side of the substrate base plate comprises:

forming the plurality of data lines on one side of the second insulating layer that is opposite to the substrate base plate;

detecting an intersecting position, wherein the first grid line and the first data line are short-circuited at the intersecting position;

forming the first breaking point at first data lines on two sides of the intersecting position, wherein in the direction of extension of the first data line, a minimum distance between the first breaking point and the grid lines is less than a preset threshold; and forming the repairing line, wherein the repairing line is connected to the first data lines located on two sides of two instances of the first breaking point, the orthographic projection of the repairing line on the substrate base plate and the orthographic projection of the first pixel electrode on the substrate base plate intersect or overlap, the orthographic projection of the repairing line on the substrate base plate and an orthographic projection of the second pixel electrode on the substrate base plate intersect or overlap, and an orthographic projection of the first grid line on the substrate base plate and the orthographic projection of the repairing line on the substrate base plate intersect; and after the step of forming the plurality of pixel electrodes on the one side of the first insulating layer that is opposite to the substrate base plate, the method further comprises:

forming a second breaking point between the second pixel electrode and the second data line, wherein the second breaking point is for breaking transmission of the second voltage signal; and forming a third breaking point between the first data line between the two first breaking points and the third pixel electrode, wherein the third breaking point is for breaking transmission of the third voltage signal.

* * * * *